(12) United States Patent
McMahill et al.

(10) Patent No.: US 8,498,086 B2
(45) Date of Patent: Jul. 30, 2013

(54) HIGH SPEED DIGITAL-TO-ANALOG CONVERTER WITH LOW VOLTAGE DEVICE PROTECTION

(75) Inventors: Daniel R. McMahill, Woodstock, GA (US); Ajay Kuckreja, Boulder, CO (US)

(73) Assignee: Maxim Integrated Products, Inc., San Jose, CA (US)

( * ) Notice: Subject to any disclaimer, the term of this patent is extended or adjusted under 35 U.S.C. 154(b) by 442 days.

(21) Appl. No.: 12/794,287

(22) Filed: Jun. 4, 2010

(65) Prior Publication Data

US 2011/0299207 A1    Dec. 8, 2011

(51) Int. Cl.
*H02H 3/20* (2006.01)
*H02H 3/24* (2006.01)
*H03M 1/66* (2006.01)
*H03M 1/00* (2006.01)

(52) U.S. Cl.
USPC .............................. 361/90; 341/141; 341/144

(58) Field of Classification Search
USPC ....................................... 361/90; 341/141, 144
See application file for complete search history.

(56) References Cited

U.S. PATENT DOCUMENTS

| | | | |
|---|---|---|---|
| 6,738,006 B1 * | 5/2004 | Mercer et al. | 341/144 |
| 6,977,602 B1 | 12/2005 | Ostrem et al. | |
| 7,456,764 B2 * | 11/2008 | Chen | 341/122 |

* cited by examiner

*Primary Examiner* — Jared Fureman
*Assistant Examiner* — Lucy Thomas (57) ABSTRACT

A digital-to-analog converter (DAC) includes a first DAC core, a second DAC core, and a butterfly switch. The first DAC core generates a first output. The second DAC core generates a second output. The butterfly switch includes at least one of switch transistors and cascode transistors. The butterfly switch selectively connects the first output and the second output to an output stage of the DAC.

27 Claims, 9 Drawing Sheets

HIGH SPEED DIGITAL-TO-ANALOG CONVERTER WITH LOW VOLTAGE DEVICE PROTECTION

FIELD

The present disclosure relates generally to signal processing systems and more particularly to high-speed digital-to-analog converters used in signal processing systems.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Figure 1:
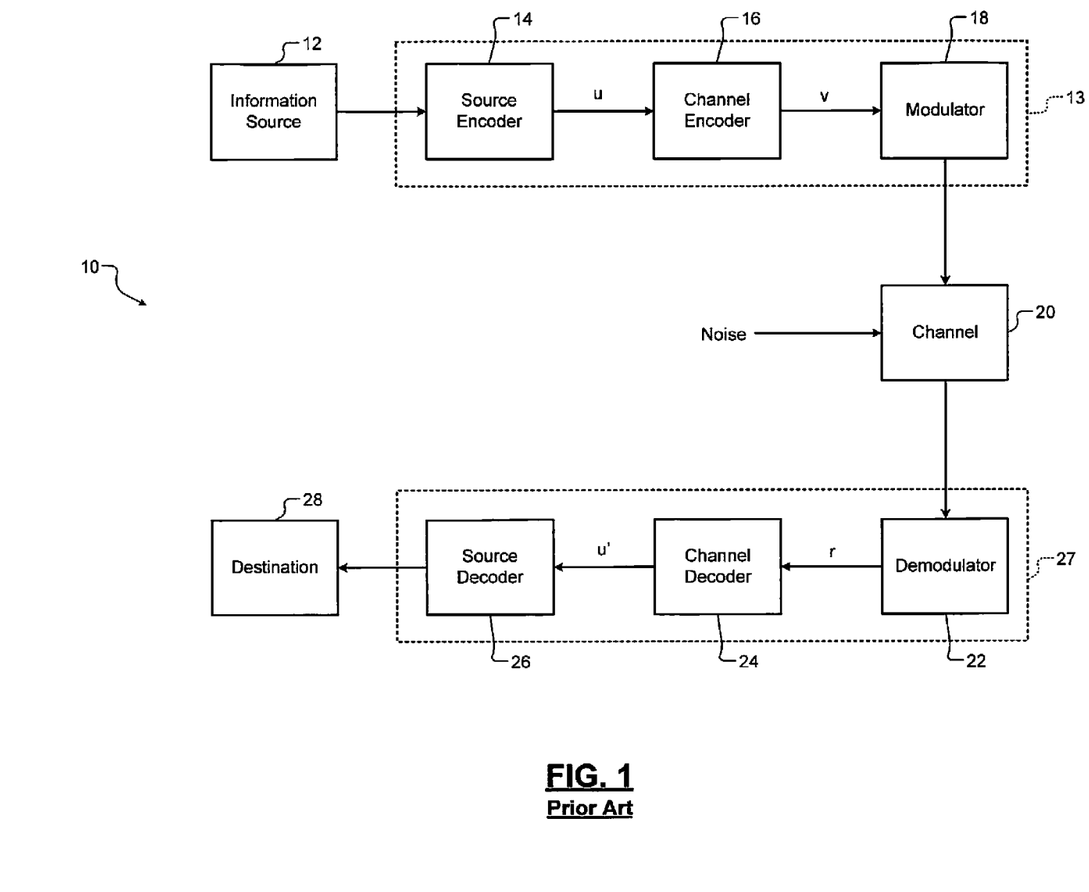
FIG. 1 is a functional block diagram of a communication system according to the prior art.

Referring now to FIG. 1, a communication system 10 is shown as an example of a signal processing system. Other examples include radar systems, automated test equipment (ATE), and so on. The communication system 10 comprises an information source 12, a transmitter 13, a communication channel 20, a receiver 27, and a destination 28. The transmitter 13 comprises a source encoder 14, a channel encoder 16, and a modulator 18. The receiver 27 comprises a demodulator 22, a channel decoder 24, and a source decoder 26.

The information source 12 may be an analog source such as a sensor that outputs information as continuous waveforms or a digital source such as a computer that outputs information in a digital form. The source encoder 14 converts the output of the information source 12 into a sequence of binary digits (bits) called an information sequence u. The channel encoder 16 converts the information sequence u into a discrete encoded sequence v called a codeword. The modulator 18 transforms the codeword into a waveform that is suitable for transmission.

The waveform output by the modulator 18 is transmitted via the communication channel 20. Typical examples of the communication channel 20 are telephone lines, wireline communication channels, wireless communication channels, optical fiber cables, and so on. Noise such as electromagnetic interference, inter-channel crosstalk may corrupt the waveform.

The demodulator 22 receives the waveform. The demodulator 22 processes each waveform and generates a received sequence r that is either a discrete (quantized) or a continuous output. The channel decoder 24 converts the received sequence r into a binary sequence u' called an estimated information sequence.

The source decoder 26 converts u' into an estimate of the output of the information source 12 and delivers the estimate to the destination 28. The estimate may be a faithful reproduction of the output of the information source 12 when u' resembles u despite decoding errors that may be caused by the noise.

SUMMARY

A digital-to-analog converter (DAC) comprises a first DAC core, a second DAC core, and a butterfly switch. The first DAC core generates a first output. The second DAC core generates a second output. The butterfly switch includes at least one of switch transistors and cascode transistors. The butterfly switch selectively connects the first output and the second output to an output stage of the DAC.

In another feature, the switch transistors and the cascode transistors have voltage ratings less than a supply voltage of the output stage.

In other features, a system comprises the DAC and a protection module that receives outputs from at least one of a power supply, a bias circuit, and a clock generator associated with the DAC. The protection module selectively operates the switch transistors in a protected mode when one of the outputs is not within a predetermined range.

In other features, a system comprises the DAC and a gate drive module that generates a protection bias voltage that biases the switch transistors to operate in a protected mode when an output of a power supply, a bias circuit, and a clock generator associated with the DAC is not within a predetermined range. The protective bias voltage is output concurrently with a supply voltage of the output stage.

In another feature, the cascode transistors are biased using a supply voltage of the output stage.

In another feature, the gate drive module sets states of clock signals that are output to gates of the switch transistors to a predetermined state when the switch transistors operate in the protected mode.

In another feature, the gate drive module generates a normal bias voltage that is used to bias the switch transistors after the power supply, the bias circuit, and the clock generator begin operating within respective predetermined ranges.

In other features, outputs of the switch transistors are input to corresponding ones of the cascode transistors, and outputs of the cascode transistors are combined at the output stage to generate an output of the DAC.

In other features, outputs of the switch transistors are combined and input to the cascode transistors, and outputs of the cascode transistors are coupled to the output stage to generate an output of the DAC.

In another feature, an output data rate of the DAC is twice a clock rate of clock signals used to drive the switch transistors when different samples are concurrently input to the first DAC core and the second DAC core.

In another feature, an output of the butterfly switch has a non-return-to-zero (NRZ) impulse response when identical samples are input to the first and second DAC cores.

In another feature, an output of the butterfly switch has a radio frequency (RF) impulse response when a sample is input to the first DAC core and an inverted version of the sample is input to the second DAC core.

In another feature, an output of the butterfly switch has a return-to-zero (RZ) impulse response when samples to be converted are input to the first DAC core and a fixed code is input to the second DAC core.

In still other features, a method of operating a digital-to-analog converter (DAC) comprises generating a first output using a first DAC core of the DAC, generating a second output using a second DAC core of the DAC, and selectively connecting the first output and the second output to an output stage of the DAC using a butterfly switch that includes at least one of switch transistors and cascode transistors.

In another feature, the switch transistors and the cascode transistors have voltage ratings less than a supply voltage of the output stage.

In other features, the method further comprises receiving outputs from at least one of a power supply, a bias circuit, and a clock generator associated with the DAC and operating the switch transistors in a protected mode when one of the outputs is not within a predetermined threshold.

In other features, the method further comprises generating a protection bias voltage and outputting the protection bias voltage concurrently with a supply voltage of the output stage. The method further comprises biasing the cascode transistors using the supply voltage. The method further comprises biasing the switch transistors to operate in a protected mode using the protection bias voltage when an output of a power supply, a bias circuit, and a clock generator associated with the DAC is not within a predetermined threshold. The method further comprises setting states of clock signals that are output to gates of the switch transistors to a predetermined state when the switch transistors operate in the protected mode. The method further comprises biasing the switch transistors using a normal bias voltage after the power supply, the bias circuit, and the clock generator begin operating within respective predetermined ranges.

In other features, the method further comprises inputting outputs of the switch transistors to corresponding ones of the cascode transistors and combining outputs of the cascode transistors at the output stage to generate an output of the DAC.

In other features, the method further comprises combining outputs of the switch transistors to generate combined outputs, inputting the combined outputs to the cascode transistors, and coupling outputs of the cascode transistors to the output stage to generate an output of the DAC.

In another feature, the method further comprises outputting data from the DAC at a data rate that is twice a clock rate of clock signals used to drive the switch transistors when different samples are concurrently input to the first and second DAC cores.

In another feature, the method further comprises generating a non-return-to-zero (NRZ) impulse response at the output stage by inputting identical samples to the first and second DAC cores.

In another feature, the method further comprises generating a radio frequency (RF) impulse response at the output stage by inputting a sample to the first DAC core and an inverted version of the sample to the second DAC core.

In another feature, the method further comprises generating a return-to-zero (RZ) impulse response at the output stage by inputting samples to the first DAC core and a fixed code is input to the second DAC core.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

The following description merely includes examples and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 2:
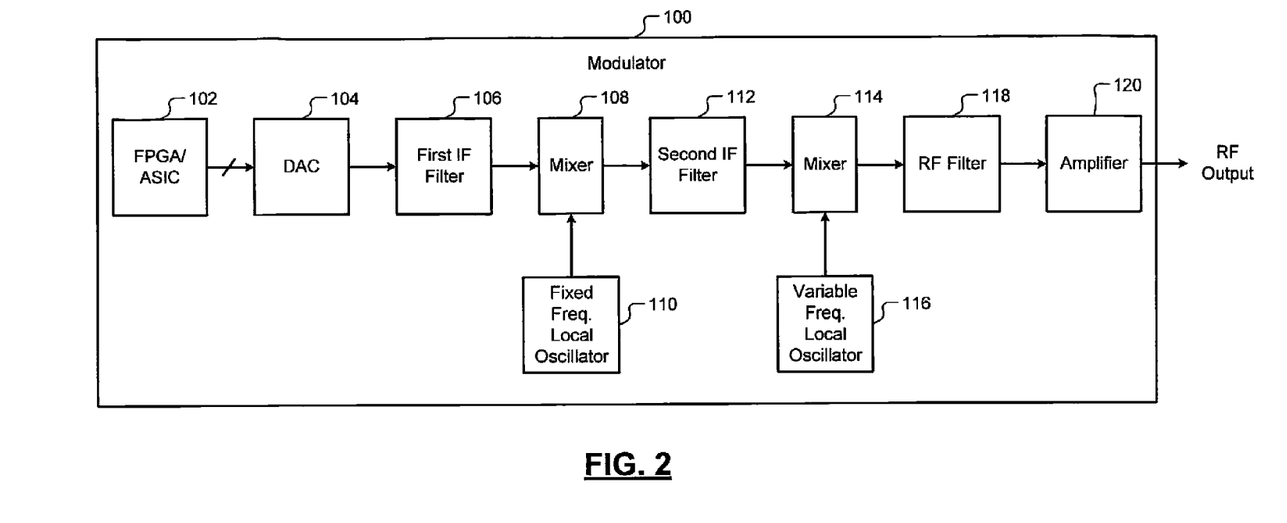
FIG. 2 is a functional block diagram of a modulator that converts a carrier frequency to a desired channel frequency using one or more frequency conversions.

Referring now to FIG. 2, a modulator 100 typically used in communication systems such as cable television systems is shown. The modulator 100 comprises a field-programmable gate-array (FPGA) or an application-specific integrated circuit (ASIC) 102 and a high-speed digital-to-analog converter (DAC) 104. Additionally, the modulator 100 comprises a first intermediate frequency (IF) filter 106, a mixer 108, a fixed-frequency local oscillator 110, a second IF filter 112, a mixer 114, and a variable-frequency local oscillator 116. Further, the modulator 100 comprises a radio frequency (RF) filter 118 and a buffer/amplifier 120.

The FPGA/ASIC 102 receives signals to be transmitted and modulates a carrier having a carrier frequency. The FPGA/ASIC 102 modulates the carrier in a digital domain using modulation such as quadrature amplitude modulation (QAM). The FPGA/ASIC 102 outputs a digitally modulated carrier.

The DAC 104 converts the modulated carrier into an analog format. The first IF filter 106 is a band-pass filter that removes images and other spurious content from an output of the DAC 104. Subsequently, one or more frequency conversions are performed to convert the carrier frequency to a desired channel frequency.

For example, a low IF signal generated by the DAC 104 is up-converted to a high IF signal using the mixer 108 and the fixed-frequency local oscillator 110. The second IF filter 112 is a band-pass filter that filters the high IF signal. The output of the second IF filter 112 is converted to a final RF carrier frequency using the mixer 114 and the variable-frequency local oscillator 116.

The RF filter 118 is a broadband filter that filters an output of the mixer 114 and passes an entire band (e.g., a cable band) to the buffer/amplifier 120. The buffer/amplifier 120 outputs an amplified final RF output that is transmitted via a communication channel (e.g., a cable).

Figure 3:
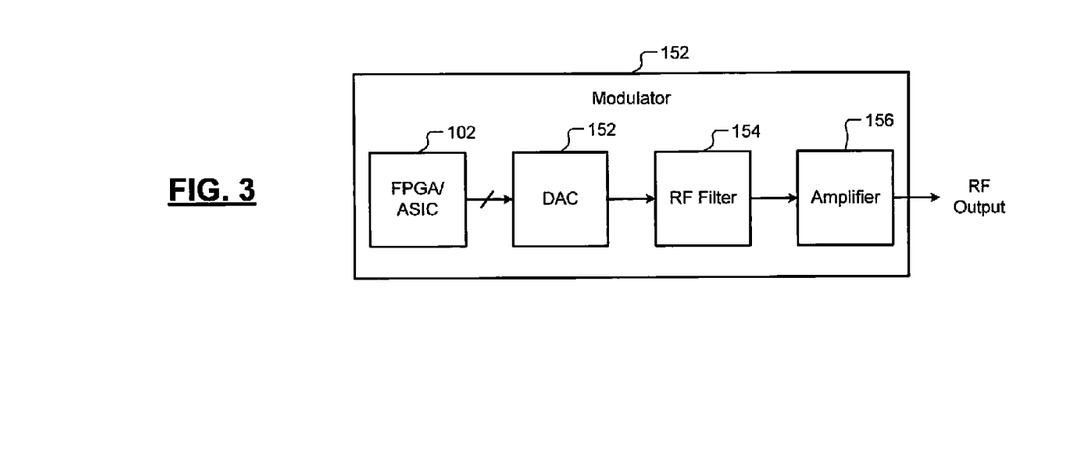
FIG. 3 is a functional diagram of a modulator that uses a direct radio frequency (RF) synthesis approach to generate a desired RF output.

Referring now to FIG. 3, a modulator 150 uses a direct RF synthesis approach to generate a desired RF output without performing multiple frequency conversions. The modulator 150 comprises the FPGA/ASIC 102, a high-speed, high-performance DAC 152, a RF filter 154, and a buffer/amplifier 156. The modulator 150 uses the high-speed high-performance DAC 152 (hereinafter DAC 152) to directly generate the desired RF output.

Using the direct RF synthesis approach, the DAC 152 generates the RF carrier directly at the final RF carrier frequency. The RF filter 154 performs minimal filtering of an output of the DAC 152 and passes an entire band to the buffer/amplifier 156. The buffer/amplifier 156 outputs an amplified final RF output that is transmitted via the communication channel. Thus, the direct RF synthesis approach reduces the amount of filtering. Particularly, the direct RF synthesis approach eliminates one or more frequency conversion stages to convert the carrier frequency to a desired channel frequency. Additionally, using the direct RF synthesis approach, many carriers can be generated using a single DAC instead of requiring multiple complete frequency conversion chains to handle multiple carriers.

The direct RF synthesis approach, however, imposes strict requirements on the performance of the DAC 152. For example, the DAC 152 has high output power, wide bandwidth, low noise, and low spurious outputs. When a large output signal is required, large devices must be used to provide sufficient headroom to handle the voltage swing. The large devices, however, have large output capacitance as well, which present large loads to clock driver circuits. Instead, by using a lower voltage device, a smaller and thus lower capacitance device may be used. In addition, in some technologies, the threshold voltage may be lower on the lower voltage devices, which assists in meeting headroom constraints.

Generally, a higher signal-to-noise ratio (SNR) is desirable. Higher SNR can be achieved with a larger current. Larger current, however, leads to large devices and large gate drive. Additionally, a higher sample rate is desirable. The higher sample rate can be achieved using devices having smaller geometry. Using devices having smaller geometry, however, can be problematic when the supply voltage is high.

Using processes that offer shorter channel length devices allows designers to design DACs that can handle larger output currents without proportionally scaling device size of the devices. Shorter channel length devices, however, have lower breakdown voltages. Lower breakdown voltages can limit the supply voltage that can be tolerated by the shorter channel length devices. Lower supply voltage, in turn, limits the output voltage swing of the DACs.

The present disclosure relates to a DAC architecture comprising output transistors that have a lower voltage rating than the supply voltage. The DAC architecture includes a protective circuit that detects several conditions that can be potentially damaging to the low-voltage devices. The protective circuit puts the low-voltage devices into a controlled and protected state when any of the potentially damaging conditions occur. With the protection provided by the protective circuit, the DAC architecture utilizes a supply voltage that is greater than the breakdown voltage of the low-voltage devices. Accordingly, the DAC architecture provides increased speed, dynamic range, and output signal swing.

Figure 4:
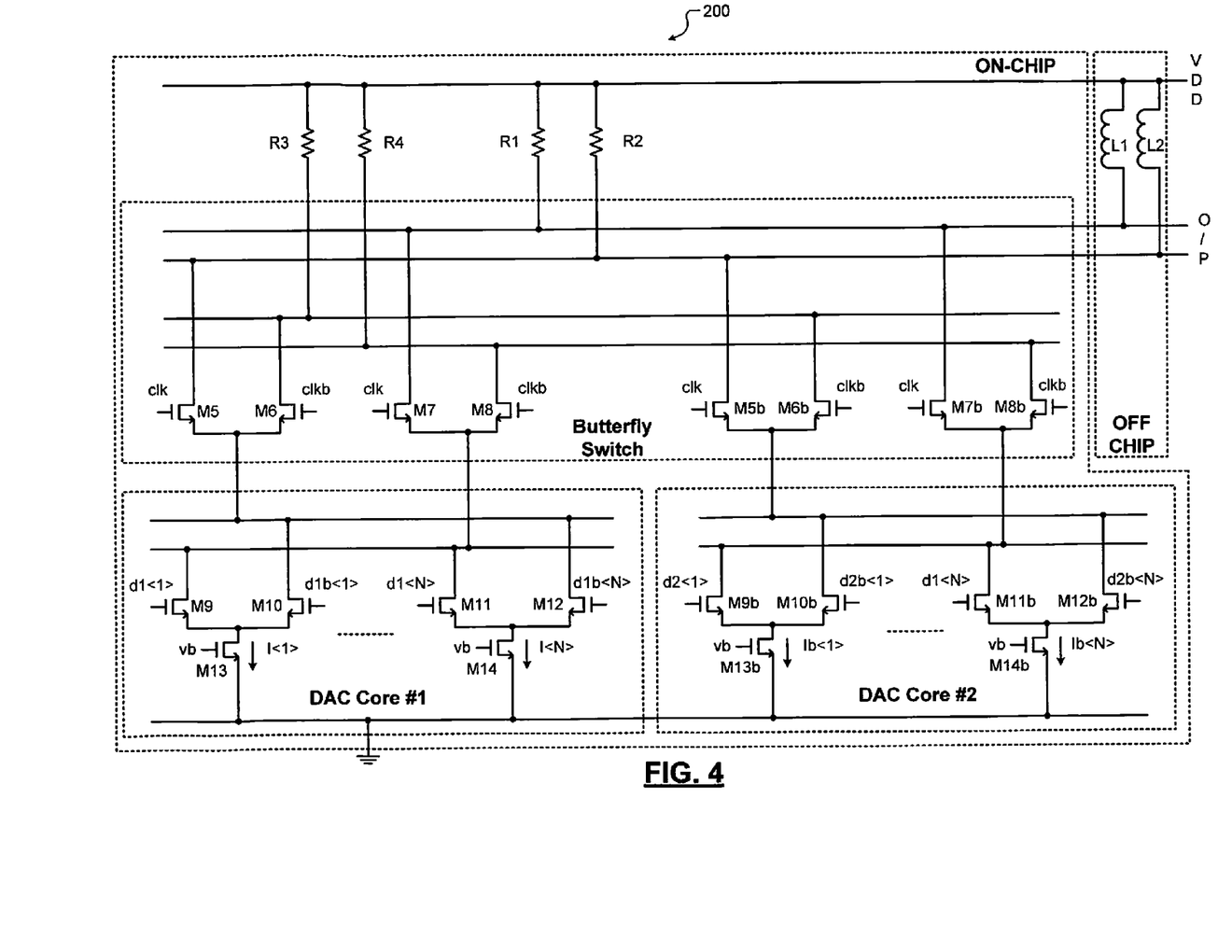
FIG. 4 is a schematic of a digital-to-analog converter (DAC) architecture comprising two DAC cores and a butterfly switch.

Referring now to FIG. 4, a DAC architecture 200 comprising two current steering DACs (DAC core #1 and DAC core #2) and a butterfly switch is shown. The butterfly switch multiplexes outputs of the two DAC cores to a differential analog output. The differential analog output is pulled up by inductances L1 and L2 as shown. The inductances L1 and L2 function as constant current sources. The two DAC cores and the butterfly switch are on-chip while the inductances L1 and L2 are off-chip. For example only, the supply voltage ($V_{DD}$) to which the differential analog output is pulled up is 3.3V, and the supply voltage for the remaining on-chip circuits is 1.8V (not shown).

The DAC core #1 comprises N current sources I<1:N> and N differential current steering switches, where N is an integer greater than 1. For example, in DAC core #1, transistor M13 is a current source that generates a current I. Transistors M9 and M10 form a differential current steering switch that routes the current I to either the positive output or the negative output of the DAC core #1. The DAC core #2 also comprises N current sources Ib<1:N> and N differential current steering switches.

The butterfly switch comprises differential switches. For example, switch transistors M5 and M6 form a differential switch. Using the differential switches, the butterfly switch connects the output of each DAC core either to the differential analog output of the chip or to an on-chip pseudo-load (also called dummy load). For example only, the switch transistors used in the butterfly switch are 3.3V devices.

Typically, a first sample is input to the DAC core #1, a second sample is input to the DAC core #2. The butterfly switch performs time-interleaving of the two DAC cores to achieve a double update rate. The DAC cores operate in a double data rate mode (also called an interleaved mode) when each DAC core receives a new sample every time, which results in a DAC update rate that is twice the clock rate. For example, in the interleaved mode, a first sample is input to the DAC core #1 at time t, and at the same time t, a second sample different than the first sample is input to the DAC core #2. The data rate at which the DAC architecture 200 outputs data is twice the clock rate of clock signals driving the switch transistors when different samples are input concurrently to the two DAC cores.

An impulse response of the output of the butterfly switch depends on inputs to the two DAC cores. For example, when the same sample is input to the two DAC cores (i.e., when the two DAC cores receive identical data), the output of the butterfly switch has a non-return-to-zero (NRZ) impulse response. When one of the DAC cores receives an inverted version of a sample input to the other DAC core (i.e., when data of opposite polarity is input to the two DAC cores), the output of the butterfly switch has a radio frequency (RF) impulse response. When one of the two DAC cores receives a fixed code (e.g., a mid-code), the output of the butterfly switch has a return-to-zero (RZ) response. More information on DACs with selectable impulse response can be found in U.S. Pat. No. 6,977,602.

Figure 5:
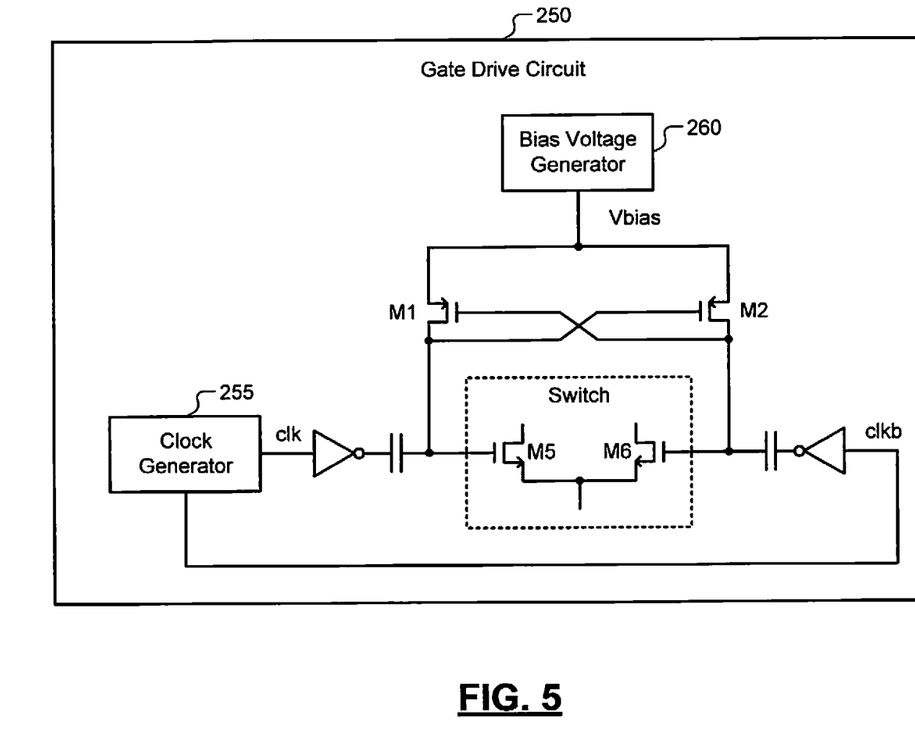
FIG. 5 is a schematic of a gate drive circuit that drives switch transistors of the butterfly switch of FIG. 4.

Referring now to FIG. 5, a gate drive circuit 250 that drives the switch transistors of the butterfly switch of FIG. 4 is shown. For simplicity, only one pair of switch transistors (M5 and M6) is shown. The gate drive circuit 250 uses a capacitive level-shifter to generate an optimal DC voltage to balance headroom between the two DAC cores and the butterfly switch. The gate drive circuit 250 comprises a clock generator 255 that generates a clock signal clk and a complementary clock signal clkb (i.e., clkb is an inverted version of clk). The clock signal clk and the complementary clock signal clkb are buffered and AC-coupled to gates of the switch transistors. Transistors M1 and M2 set a peak gate drive voltage of the switch transistors to a bias voltage $V_{bias}$.

The gate drive circuit 250 comprises a bias voltage generator 260 that generates the bias voltage $V_{bias}$. For example, when the supply voltage ($V_{DD}$) used is 3.3V, the bias voltage $V_{bias}$ is set to generate approximately 1.8V at a common-source node of the switch transistors. A DC drain-to-source voltage is then nominally 3.3V to 1.8V or 1.5V.

When output signal swing is increased, if the device size of the transistors is scaled up to handle the larger current, the capacitance at output nodes becomes large. Alternatively, if low-voltage transistors (e.g., 2V-transistors) are used, the drain-to-source voltage stress becomes high. For example, the switch transistors need to tolerate the difference between the 3.3V and 1.8V supply voltages (i.e., 1.5V) plus another 0.5V of output signal swing (i.e., a total of 2V). When supply voltage tolerances are considered, the voltage stress can be greater than the maximum 2V rating of the switch transistors.

Figure 6:
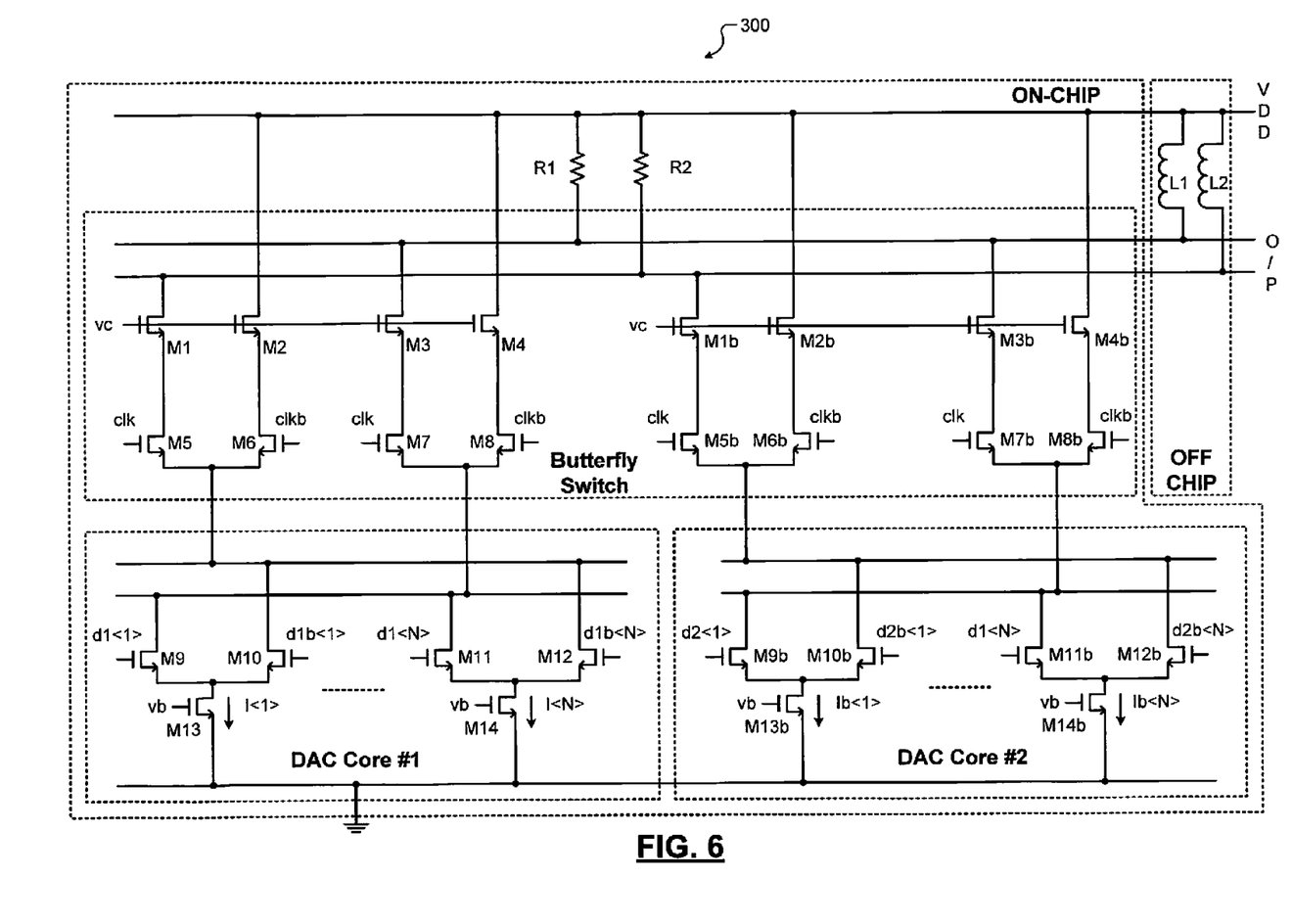
FIG. 6 is a schematic of a DAC architecture that uses cascoded differential switches and combines output signals of switch transistors after cascoding.

Referring now to FIG. 6, the DAC architecture 300 uses cascoded differential switches and provides high output signal swing while using low-voltage transistors. Cascode transistors, M1-M4 and M1b-M4b, share the voltage drop with the switch transistors M5-M8 and M5b-M8b. A cascode bias voltage ($V_C$) (i.e., a bias voltage of the cascode transistors) is typically set to $V_{DD}$ to provide sufficient headroom between the transistors of the butterfly switch and the two DAC cores (e.g., between transistors M1, M5, M9, and M13; transistors M2, M6, M10, and M13; and so on). Aside from scaled-up widths of the devices to handle larger currents, the DAC cores are similar to the DAC cores shown in FIG. 4.

The low-voltage transistors used in the DAC architecture 300 can be subjected to over-voltage stresses when the chip is powering up or powering down. For example, during power up, the 3.3V power supply may stabilize before the 1.8V power supply and may be applied to the chip before the 1.8V power supply. When the 3.3V power supply is applied before the 1.8V power supply, the cascode transistors may be subjected to the entire 3.3V supply voltage. Several other potentially damaging conditions discussed below may occur during power up, power down, or normal operation.

Figure 7:
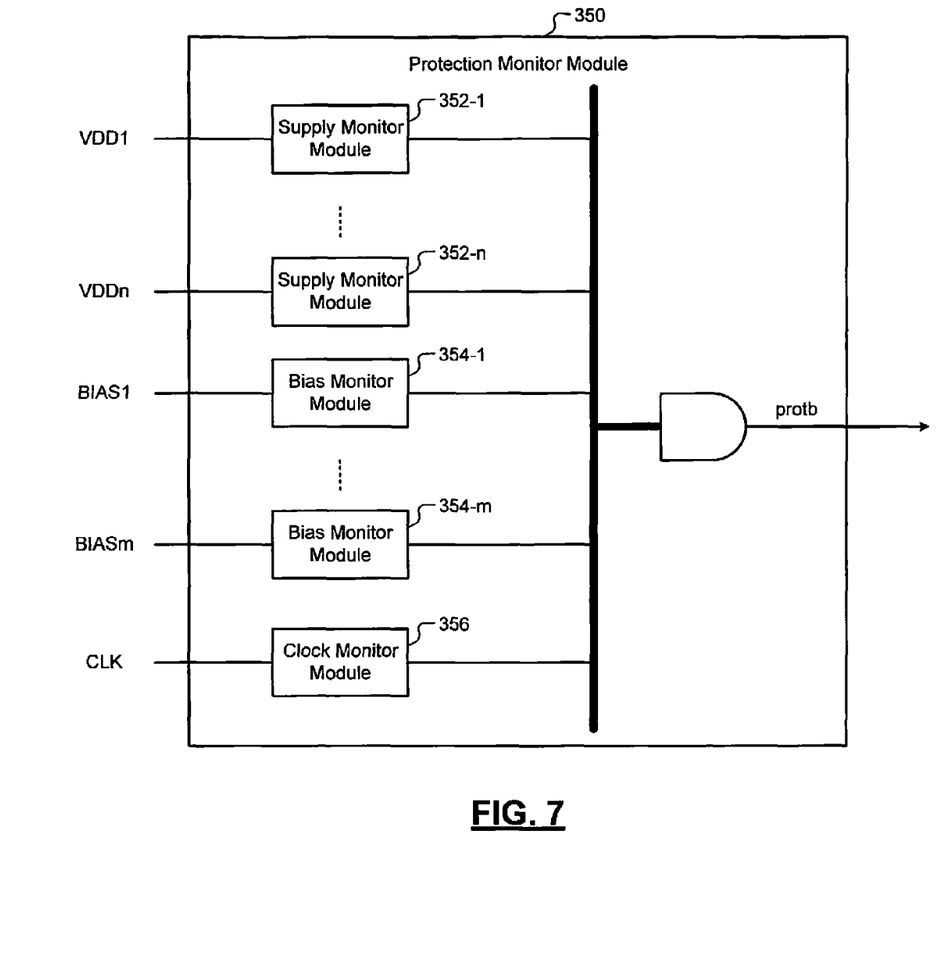
FIG. 7 is a functional block diagram of a protection monitor module that protects low-voltage transistors used in the DAC architecture shown in FIG. 6.

Referring now to FIG. 7, a protection monitor module 350 monitors several potentially damaging conditions and prevents damage to the low-voltage transistors. For example, the protection monitor module 350 monitors n supply voltages (e.g., $V_{DD1}, \ldots,$ and $V_{DDn}$), m bias currents and/or bias voltages (e.g., BIAS1, ..., and BIASm), and clocks (e.g., clk, clkb), where n and m are integers greater than or equal to 1.

The protection monitor module 350 generates a control signal (protb) having a first state (e.g., low) when any of the following conditions are true: (1) a supply voltage is outside of a normal operating range, (2) a bias current and/or bias voltage is not stabilized, or (3) a clock is not running. When the protb signal is asserted (e.g., driven low), the butterfly switch is placed into a protected mode, and the clocks for the chip are placed into a known state as explained below.

The protection monitor module 350 comprises n supply monitor modules 352-1, ..., and 352-n (collectively supply monitor modules 352) that monitor the n supply voltages (e.g., $V_{DD1}, \ldots,$ and $V_{DDn}$), respectively. Each of the supply monitor modules 352 monitors a different supply voltage (e.g., 3.3V, 1.8V, etc.) and generates a control signal having a first state (e.g., low) when an overvoltage or an under-voltage condition is detected in a corresponding supply voltage.

For example, each of the supply monitor modules 352 may generate a control signal having the first state when a corresponding supply voltage is greater than a first threshold indicating an overvoltage condition or when the corresponding supply voltage is less than a second threshold indicating an under-voltage condition. The power supplies that generate the supply voltages may be on-chip (i.e., internal to the chip) or off-chip (i.e., external to the chip).

Additionally, the protection monitor module 350 comprises m bias monitor modules 354-1, ..., and 354-N (collectively bias monitor modules 354) that monitor m bias currents and/or bias voltages (e.g., BIAS1, ..., and BIASm), respectively. Each of the bias monitor modules 354 monitors a different bias current and/or bias voltage. Each of the bias monitor modules 354 generates a control signal having a first state (e.g., low) when a corresponding bias current and/or bias voltage is greater than a first threshold and/or less than a second threshold. The bias currents and/or bias voltages may be generated on-chip or off-chip.

Further, the protection monitor module 350 comprises a clock monitor module 356 that monitors clocks. The clocks may be generated on-chip or off-chip. The clock monitor module 356 generates a control signal having a first state (e.g., low) when one or more of the clocks are not running or when one or more parameters of the clocks (e.g., frequency, duty cycle, etc.) are not within a predetermined range.

The protection monitor module 350 comprises a combinational logic gate (e.g., an AND gate, a NAND gate, etc.) that receives the control signals generated by the supply monitor modules 352, the bias monitor modules 354, and the clock monitor module 356. The combinational logic gate generates the protb signal having a first state (e.g., low) when any of the control signals has the first state (e.g., low).

For example, if the combinational logic gate is an AND gate as shown, the protb signal has a low state (logic 0) when any of the inputs to the AND gate has a low state. Thus, the protb signal is asserted (e.g., is driven low) when any of the three conditions listed above occur. In other words, the protb signal is asserted when an input to the supply monitor modules 352, the bias monitor modules 354, or the clock monitor module 356 is not within a predetermined range.

As explained below, the protb signal is used to set the butterfly switch shown in FIG. 6 into a protected mode. In the protected mode, the differential switches of the butterfly switch are driven such that they are protected from the potentially damaging conditions. Additionally, the protb signal sets the clocks into a known state.

Figure 8:
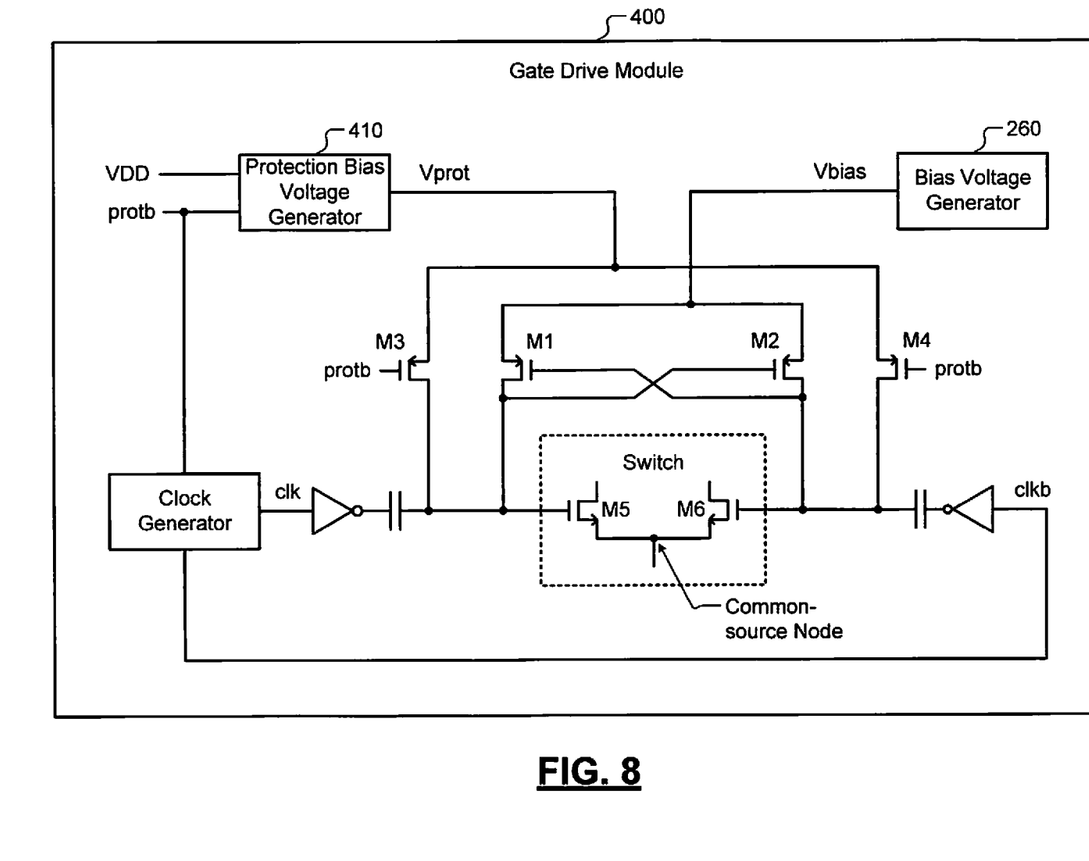
FIG. 8 is a schematic of a gate drive module that selectively drives switch transistors shown in FIG. 6 in a protected mode.

Referring now to FIG. 8, a gate drive module 400 that drives the switch transistors of the butterfly switch of FIG. 6 in the protected mode is shown. Only one pair of switch transistors (M5 and M6) is shown for simplicity. The gate drive module 400 comprises all elements of the gate drive circuit 250 shown in FIG. 4. Additionally, the gate drive module 400 comprises transistors M3 and M4, which are used to protect the switch transistors based on the protb signal.

In the protected mode (i.e., when the protb signal is asserted (e.g., low)), M3 and M4 are both turned on, which turns on the switch transistors of the butterfly switch shown in FIG. 6. Additionally, both phases of the clock (clk and clkb) are forced low, which causes outputs of the inverters shown in FIG. 8 to go high. Gates of the switch transistors are driven by a protection bias voltage $V_{prot}$.

The gate drive module 400 comprises a protection bias voltage generator 410 that generates the protection bias voltage $V_{prot}$ based on the protb signal. The protection bias voltage generator 410 generates the protection bias voltage $V_{prot}$ from a known voltage derived from the higher 3.3V supply voltage. The protection bias voltage $V_{prot}$ comes up along with the 3.3V supply voltage during power up.

In addition to forcing the switch transistors and the cascode transistors to share the supply voltage ($V_{DD}$), the capacitors that couple the clock signal to the gates of the switch transistors are initialized to a voltage equal to ($V_{DD}-V_{bias}$). Initializing the capacitors to ($V_{DD}-V_{bias}$) protects the switch transistors when the protected mode is terminated by de-asserting the protb signal after the potentially damaging conditions cease to exist.

Thus, the gate drive module 400 provides an additional control path for protecting the switch transistors during any of the following: power up and power down transitions, loss of clock condition (e.g., if a voltage controlled oscillator comes up slowly), and slow turn-on of reference circuits (e.g., if 3.3V power supply is up but 1.8V power supply is not yet up). The bias voltage $V_{bias}$ does not stabilize until both power supplies (e.g., 3.3V and 1.8V) and reference circuits are up and operating normally (i.e., within respective specified ranges). The protection bias voltage $V_{prot}$ comes up concurrently with the 3.3V power supply during power up and protects the switch transistors.

Figure 9:
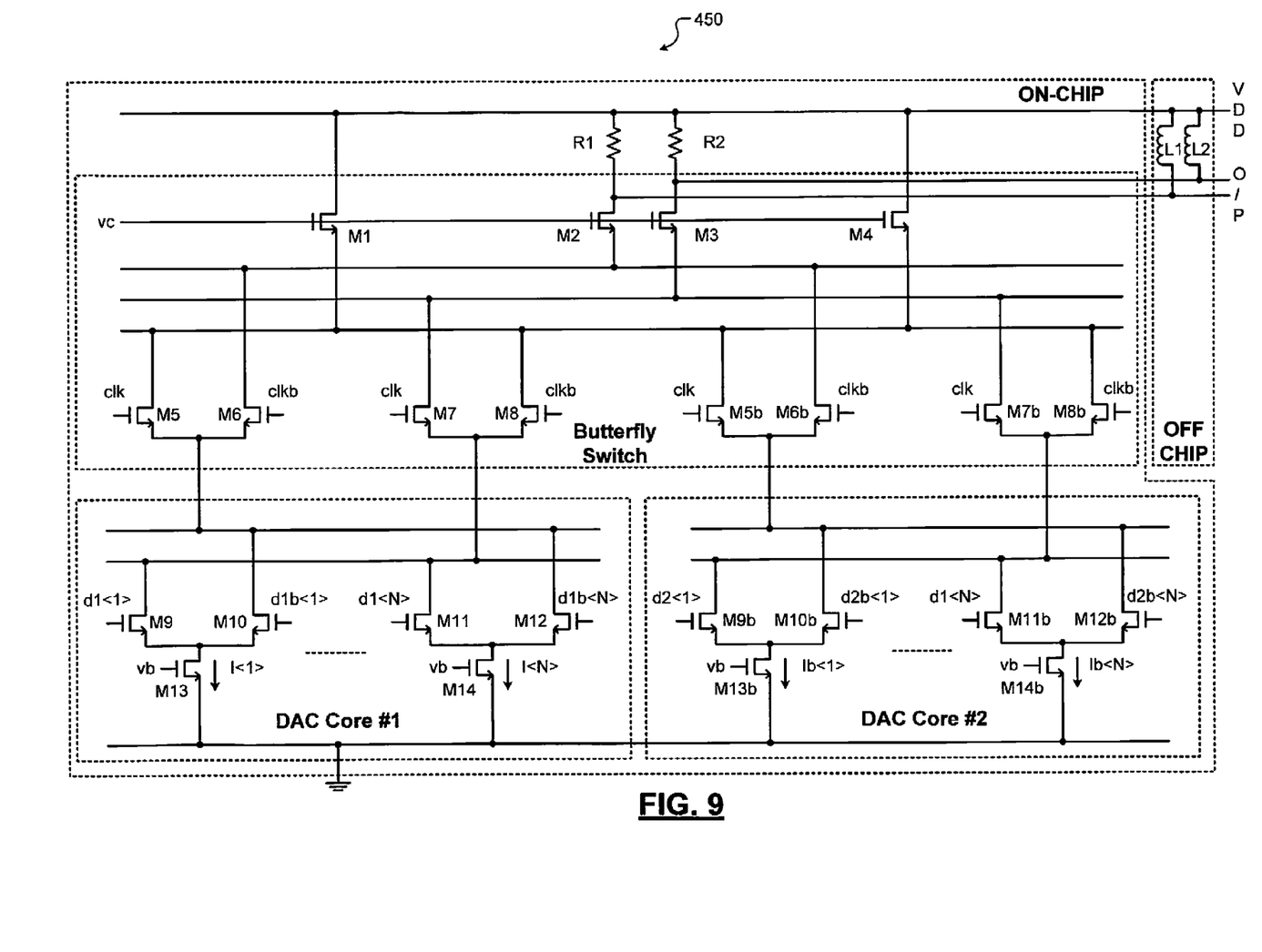
FIG. 9 is a schematic of a DAC architecture that uses cascoded differential switches and combines output signals of switch transistors before cascoding.

Referring now to FIG. 9, an alternative DAC architecture 450 is shown. As in FIG. 6, the transistors shown in FIG. 9 are low-voltage devices. FIG. 6 and FIG. 9 differ as follows. In FIG. 6, each switch transistor has an associated cascode transistor, and the outputs of the switch transistors are combined after cascoding. In contrast, in FIG. 9, output signals of the switch transistors are combined before cascoding, and combined output signals of the switch transistors pass through the cascode transistors. In FIGS. 6 and 9, the butterfly switch performs time-interleaving of the two DAC cores to achieve a double update rate.

Figure 10:
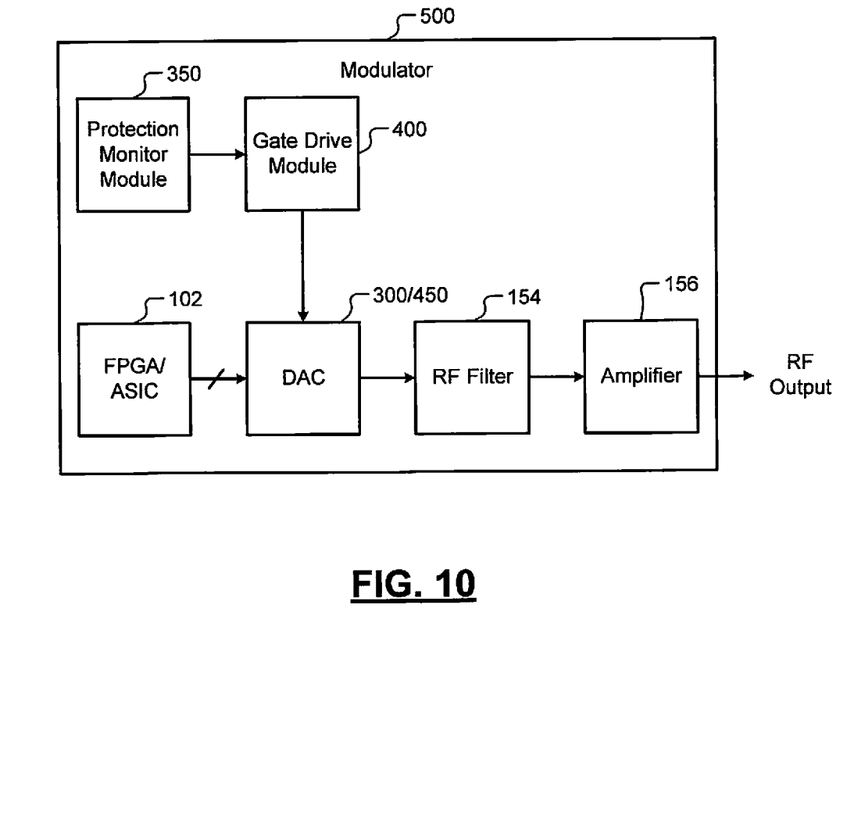
FIG. 10 is a functional block diagram of a modulator that uses the DAC architecture of FIG. 6 or FIG. 9 and that uses the protection monitor module of FIG. 7 and the gate drive module of FIG. 8.

Referring now to FIG. 10, a modulator 500 according to the present disclosure is shown. The modulator 500 comprises the FPGA/ASIC 102, the DAC architecture 300 or 450, the protection monitor module 350, the gate drive module 400, the RF filter 154, and the buffer/amplifier 156. The FPGA/ASIC 102, the DAC architecture 300/450, the protection monitor module 350, the gate drive module 400, the RF filter 154, and the buffer/amplifier 156 operate as described above.

The modulator 500 is only an example used to illustrate an application where the teachings of the present disclosure can be used. Additional applications include, but are not limited to, radar systems, automated test equipment (ATE), and so on. Other applications are contemplated and will become apparent to a skilled practitioner from the present disclosure.

Throughout the present disclosure, DAC architectures are described using only two DAC cores. The teachings of the present disclosure, however, are applicable to DAC architectures comprising more than two DAC cores. Additionally, values and polarities used for various voltages and signal states are for example only, and other suitable values and polarities may be used instead. Further, negative metal-oxide semiconductor (NMOS) transistors and/or positive MOS (PMOS) transistors are shown for example only, and other transistors (e.g., complementary MOS (CMOS) transistors) may be used instead.

Further, while protecting low-voltage devices (e.g., switch transistors and cascode transistors) is described as an example, the teachings of the present disclosure are not limited to protecting only low-voltage devices. Rather, devices having diverse voltage ratings can be protected using the protection systems and methods described herein.

While exemplary implementations described herein describe butterfly switches with differential switches and cascode transistors, skilled artisans will appreciate that the butterfly switches may be implemented using the differential switches without the cascode transistors. When the cascode transistors are omitted, the differential switches in the butterfly switches directly drive the output.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system comprising:
    a digital-to-analog converter (DAC) comprising:
        a first DAC core that generates a first output;
        a second DAC core that generates a second output; and
        a butterfly switch that includes switch transistors,
            wherein said butterfly switch selectively connects said first output and said second output to an output stage of said DAC; and
    a gate drive module that generates a protection bias voltage that biases said switch transistors to operate in a protected mode when an output of a power supply, a bias circuit, and a clock generator associated with said DAC is not within a predetermined range,
    wherein said protective bias voltage is output concurrently with a supply voltage of said output stage.

2. The system of claim 1 further comprising cascode transistors, wherein said switch transistors and said cascode transistors have voltage ratings less than said supply voltage of said output stage.

3. The system of claim 1 further comprising cascode transistors, wherein said cascode transistors are biased using said supply voltage of said output stage.

4. The system of claim 1 wherein said gate drive module sets states of clock signals that are output to gates of said switch transistors to a predetermined state when said switch transistors operate in said protected mode.

5. The system of claim 1 wherein said gate drive module generates a normal bias voltage that is used to bias said switch transistors after said power supply, said bias circuit, and said clock generator begin operating within respective predetermined ranges.

6. The system of claim 1 further comprising cascode transistors, wherein outputs of said switch transistors are input to corresponding ones of said cascode transistors, and wherein outputs of said cascode transistors are combined at said output stage to generate an output of said DAC.

7. The system of claim 1 further comprising cascode transistors, wherein outputs of said switch transistors are combined and input to said cascode transistors, and wherein outputs of said cascode transistors are coupled to said output stage to generate an output of said DAC.

8. The system of claim 1 wherein an output data rate of said DAC is twice a clock rate of clock signals used to drive said switch transistors when different samples are concurrently input to said first DAC core and said second DAC core.

9. The system of claim 1 wherein an output of said butterfly switch has a non-return-to-zero (NRZ) impulse response when identical samples are input to said first and second DAC cores.

10. The system of claim 1 wherein an output of said butterfly switch has a radio frequency (RF) impulse response when a sample is input to said first DAC core and an inverted version of said sample is input to said second DAC core.

11. The system of claim 1 wherein an output of said butterfly switch has a return-to-zero (RZ) impulse response when samples to be converted are input to said first DAC core and a fixed code is input to said second DAC core.

12. A method of operating a digital-to-analog converter (DAC), comprising:
    generating a first output using a first DAC core of said DAC;
    generating a second output using a second DAC core of said DAC;

selectively connecting said first output and said second output to an output stage of said DAC using a butterfly switch that includes switch transistors and cascode transistors;
generating a protection bias voltage;
outputting said protection bias voltage concurrently with a supply voltage of said output stage;
biasing said cascode transistors using said supply voltage;
biasing said switch transistors to operate in a protected mode using said protection bias voltage when an output of a power supply, a bias circuit, and a clock generator associated with said DAC is not within a predetermined threshold;
setting states of clock signals that are output to gates of said switch transistors to a predetermined state when said switch transistors operate in said protected mode; and
biasing said switch transistors using a normal bias voltage after said power supply, said bias circuit, and said clock generator begin operating within respective predetermined ranges.

13. The method claim 12 wherein said switch transistors and said cascode transistors have voltage ratings less than said supply voltage of said output stage.

14. The method of claim 12 further comprising:
inputting outputs of said switch transistors to corresponding ones of said cascode transistors; and
combining outputs of said cascode transistors at said output stage to generate an output of said DAC.

15. The method of claim 12 further comprising:
combining outputs of said switch transistors to generate combined outputs;
inputting said combined outputs to said cascode transistors; and
coupling outputs of said cascode transistors to said output stage to generate an output of said DAC.

16. The method of claim 12 further comprising:
outputting data from said DAC at a data rate that is twice a clock rate of clock signals used to drive said switch transistors when different samples are concurrently input to said first and second DAC cores;
generating a non-return-to-zero (NRZ) impulse response at said output stage by inputting identical samples to said first and second DAC cores;
generating a radio frequency (RF) impulse response at said output stage by inputting a sample to said first DAC core and an inverted version of said sample to said second DAC core; or
generating a return-to-zero (RZ) impulse response at said output stage by inputting samples to said first DAC core and a fixed code is input to said second DAC core.

17. A digital-to-analog converter (DAC) comprising:
a first DAC core that generates a first output;
a second DAC core that generates a second output; and
a butterfly switch that includes switch transistors and cascode transistors,
wherein said butterfly switch selectively connects said first output and said second output to an output stage of said DAC, and
wherein said cascode transistors are biased using a supply voltage of said output stage; and
a gate drive module that generates a protection bias voltage that biases said switch transistors to operate in a protected mode when an output of a power supply, a bias circuit, and a clock generator associated with said DAC is not within a predetermined range,
wherein said protective bias voltage is output concurrently with said supply voltage of said output stage.

18. The DAC of claim 17 wherein said switch transistors and said cascode transistors have voltage ratings less than said supply voltage of said output stage.

19. The DAC of claim 17 further comprising:
a protection module that receives outputs from at least one of said power supply, said bias circuit, and said clock generator associated with said DAC,
wherein said protection module selectively operates said switch transistors in the protected mode when one of said outputs is not within said predetermined range.

20. The DAC of claim 17 wherein said gate drive module sets states of clock signals that are output to gates of said switch transistors to a predetermined state when said switch transistors operate in said protected mode.

21. The DAC of claim 17 wherein said gate drive module generates a normal bias voltage that is used to bias said switch transistors after said power supply, said bias circuit, and said clock generator begin operating within respective predetermined ranges.

22. The DAC of claim 17 wherein outputs of said switch transistors are input to corresponding ones of said cascode transistors, and wherein outputs of said cascode transistors are combined at said output stage to generate an output of said DAC.

23. The DAC of claim 17 wherein outputs of said switch transistors are combined and input to said cascode transistors, and wherein outputs of said cascode transistors are coupled to said output stage to generate an output of said DAC.

24. The DAC of claim 17 wherein an output data rate of said DAC is twice a clock rate of clock signals used to drive said switch transistors when different samples are concurrently input to said first DAC core and said second DAC core.

25. The DAC of claim 17 wherein an output of said butterfly switch has a non-return-to-zero (NRZ) impulse response when identical samples are input to said first and second DAC cores.

26. The DAC of claim 17 wherein an output of said butterfly switch has a radio frequency (RF) impulse response when a sample is input to said first DAC core and an inverted version of said sample is input to said second DAC core.

27. The DAC of claim 17 wherein an output of said butterfly switch has a return-to-zero (RZ) impulse response when samples to be converted are input to said first DAC core and a fixed code is input to said second DAC core.

* * * * *

UNITED STATES PATENT AND TRADEMARK OFFICE
CERTIFICATE OF CORRECTION

PATENT NO. : 8,498,086 B2
APPLICATION NO. : 12/794287
DATED : July 30, 2013
INVENTOR(S) : Daniel R. McMahill et al.

Page 1 of 1

It is certified that error appears in the above-identified patent and that said Letters Patent is hereby corrected as shown below:

In the Drawings:

Sheet 2 of 9, Reference
Numeral 152, Line 1, Fig. 3          Delete "152" and insert --150--

Signed and Sealed this
Fourth Day of March, 2014

Michelle K. Lee
*Deputy Director of the United States Patent and Trademark Office*